(12) United States Patent
Hollis et al.

(10) Patent No.: US 9,337,807 B2
(45) Date of Patent: May 10, 2016

(54) OUTPUT DRIVER CIRCUIT WITH AUTO-EQUALIZATION BASED ON DRIVE STRENGTH CALIBRATION

(71) Applicant: QUALCOMM Incorporated, San Diego, CA (US)

(72) Inventors: Timothy Mowry Hollis, Boise, ID (US); Thomas Clark Bryan, San Diego, CA (US); Mark Wayland, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 116 days.

(21) Appl. No.: 14/503,090

(22) Filed: Sep. 30, 2014

(65) Prior Publication Data

US 2016/0094202 A1    Mar. 31, 2016

(51) Int. Cl.
*H03K 3/00* (2006.01)
*H03K 3/011* (2006.01)
*G11C 11/4096* (2006.01)

(52) U.S. Cl.
CPC ............ *H03K 3/011* (2013.01); *G11C 11/4096* (2013.01)

(58) Field of Classification Search
None
See application file for complete search history.

(56) References Cited

U.S. PATENT DOCUMENTS

| | | | |
|---|---|---|---|
| 6,278,306 B1 | 8/2001 | Ang et al. | |
| 6,288,563 B1 | 9/2001 | Muljono et al. | |
| 6,294,924 B1 | 9/2001 | Ang et al. | |
| 7,782,081 B2 | 8/2010 | Kim et al. | |
| 7,944,233 B1 * | 5/2011 | Lee | G11C 7/1051 326/27 |
| 8,416,634 B2 * | 4/2013 | Kim | G11C 7/1051 365/189.07 |
| 8,581,649 B2 * | 11/2013 | Nishio | H03K 19/00361 327/108 |
| 2007/0103186 A1 * | 5/2007 | Clements | H04L 25/028 326/30 |
| 2009/0072855 A1 * | 3/2009 | Ayyapureddi | H03K 19/00384 326/30 |
| 2010/0045338 A1 | 2/2010 | Kodato | |
| 2010/0060317 A1 * | 3/2010 | Ahn | G11C 7/1051 326/30 |
| 2011/0163778 A1 * | 7/2011 | Moon | G11C 5/063 326/30 |
| 2013/0009669 A1 * | 1/2013 | Rao | H04L 25/0272 327/108 |
| 2013/0057321 A1 * | 3/2013 | Rao | H04L 25/0274 327/108 |
| 2013/0076395 A1 * | 3/2013 | Kim | H03K 19/018585 326/87 |
| 2014/0192583 A1 * | 7/2014 | Rajan | G11C 7/10 365/63 |

OTHER PUBLICATIONS

International Search Report and Written Opinion—PCT/US2015/043305—ISA/EPO—Oct. 21, 2015.

* cited by examiner

*Primary Examiner* — Lincoln Donovan
*Assistant Examiner* — Khareem E Almo
(74) *Attorney, Agent, or Firm* — Procopio, Cory, Hargreaves & Savitch, LLP (57) ABSTRACT

Systems and methods for equalizing an output driver circuit based on information from calibration of the output impedance of the driver circuit are disclosed. Settings that result from the calibration are referred to as calibration codes. The output driver circuit includes multiple pull-up elements that are enabled or disabled to produce a desired output impedance when the output is high and multiple pull-down elements that are enabled or disabled to produce the desired output impedance when the output is low. The number of pull-up elements that are enabled and the number of pull-down elements that are enabled is set by calibration. The results of the calibration (i.e., the number of enabled elements for the pull-up and the number of enabled elements for the pull-down) are used to set controls for an amount of pre-emphasis and/or to set controls for output slew rates.

30 Claims, 6 Drawing Sheets

OUTPUT DRIVER CIRCUIT WITH AUTO-EQUALIZATION BASED ON DRIVE STRENGTH CALIBRATION

BACKGROUND

1. Field

The present invention relates to integrated circuits and, more particularly, to output driver circuits with auto-equalization based on drive strength calibration.

2. Background

Operating an integrated circuit with precise electric characteristics has become increasingly important. For example, interfaces to memories have increased in speed and require precise driver circuits.

When chip-to-chip interface speeds exceed channel (e.g., the link between a processor or system on a chip (SoC) and memory) bandwidths, it becomes necessary to equalize the transmitted signal. Equalization can take on many forms, but generally it either emphasizes high frequency components or de-emphasizes low frequency components in the signal. The equalization can include, for example, adjusting slew rates of transitions on the transmitted signal and/or adding pre-emphasis by increasing the signal drive at the start of transitions on the output signal.

Various DRAM interface standards include procedures to calibrate the off-chip drive strength and/or the on-die termination resistance. An example procedure includes calibrating, using a voltage-divider technique, either the pull-up or pull-down drive strength relative to a precision resistance mounted on a system board. Then the remaining pull-down or pull-up drive strength is calibrated relative to the calibrated pull-up or pull-down drive strength using a voltage-divider technique.

This calibration is often applied to just one leg of a multi-leg driver, with the additional legs then using the same calibration setting during subsequent operation. For example, traditionally, double data rate (DDR) synchronous dynamic random access memory (SDRAM) interfaces have calibrated a unit pull-up leg to an impedance of 240Ω (ohms) by placing a unit pull-up leg in series with a precision, off-chip, 240Ω resistor and adjusting the strength of the unit pull-up leg so that the voltage between the pull-up leg and the resistor is close to VDDQ/2 (one-half the relevant supply voltage). This type of calibration can provide accurate output impedance but does not provide equalization.

In traditional memory interface standards, equalization is not defined, and no means is built into the specification to calibrate equalization. Thus, if equalization is used, it is typically set based on lab measurements, and the degree of equalization then remains fixed for a particular product design. Thus, integrated circuits fabricated with slow process conditions and integrated circuits fabricated with fast process conditions operate with the same equalization settings. This can result in performance degradation; for example, integrated circuits fabricated with slow process conditions may not amplify high-frequency components sufficiently and integrated circuits fabricated with fast process conditions may have excess high-frequency amplification resulting in excess noise. However, the best performing equalization settings will vary with the specific process conditions used to fabricate a particular product as well as with other conditions that affect performance, for example, temperature and supply voltage.

Accordingly, systems and methods are needed to automatically set the degree of equalization without user input, based on the information made available through the calibration procedures provided by the standards.

SUMMARY

In one aspect, an output driver circuit is provided that includes a driver module configured to drive an output of the output driver circuit, wherein the driver module has one or more controllable output impedances set by one or more calibration codes and one or more equalization levels set by one or more equalization codes; and a calibration control module configured to calibrate the driver module to determine the one or more calibration codes to set the output impedance of the driver module to one or more predetermined impedances determine the one or more equalization codes based on the one or more calibration codes.

In one aspect, a method of auto-equalizing an output driver circuit is provided. The method includes: calibrating an output impedance of the output driver circuit to determine at least one calibration code that produces a predetermined impedance; determining an equalization setting for the output driver circuit based on the at least one calibration code; and setting an equalization control of the output driver circuit using the equalization setting.

In one aspect, an output driver circuit is provided that includes: a plurality of means for driving an output having their outputs coupled in parallel to an output of the output driver circuit, wherein each of the means for driving includes: a pull-up output stage having a controllable output impedance set by a first calibration code; a pull-down output stage having a controllable output impedance set by a second calibration code; a pull-up pre-driver configured to switch the pull-up output stage off and on based on a pull-up enable signal; and a pull-down pre-driver configured to switch the pull-down output stage off and on based on a pull-down enable signal; and a means for calibrating the output driver circuit configured to calibrate the output driver circuit to determine the first calibration code and the second calibration code to set the output impedance of the output driver circuit and determine one or more equalization settings for the output driver circuit based on the first calibration code and the second calibration code.

Other features and advantages of the present invention should be apparent from the following description which illustrates, by way of example, aspects of the invention.

BRIEF DESCRIPTION OF THE DRAWINGS

The details of the present invention, both as to its structure and operation, may be gleaned in part by study of the accompanying drawings, in which like reference numerals refer to like parts, and in which.

DETAILED DESCRIPTION

The detailed description set forth below, in connection with the accompanying drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in simplified form in order to avoid obscuring such concepts.

Systems and methods for equalizing an output driver circuit based on information from calibration of the output impedance of the driver circuit are disclosed. Settings that result from the calibration are referred to as calibration codes. The output driver circuit can use calibration codes to automatically determine equalization codes that predistort the output so that signals from the output driver circuit are equalized after transmission through a communication channel. The output driver circuit can determine the equalization codes to compensate for the effect of the communication channel and to compensate for variations in the output driver circuit (e.g., due to process, voltage, and temperature). In an embodiment, the output driver circuit includes multiple pull-up elements that are enabled or disabled to produce a desired output impedance when the output is high and multiple pull-down elements that are enabled or disabled to produce the desired output impedance when the output is low. The number of pull-up elements that are enabled and the number of pull-down elements that are enabled is set by calibration. The results of the calibration (the number of enabled elements for the pull-up and the number of enabled elements for the poll-down) are used to set controls for an amount of pre-emphasis and/or to set controls for output slew rates.

Figure 1:
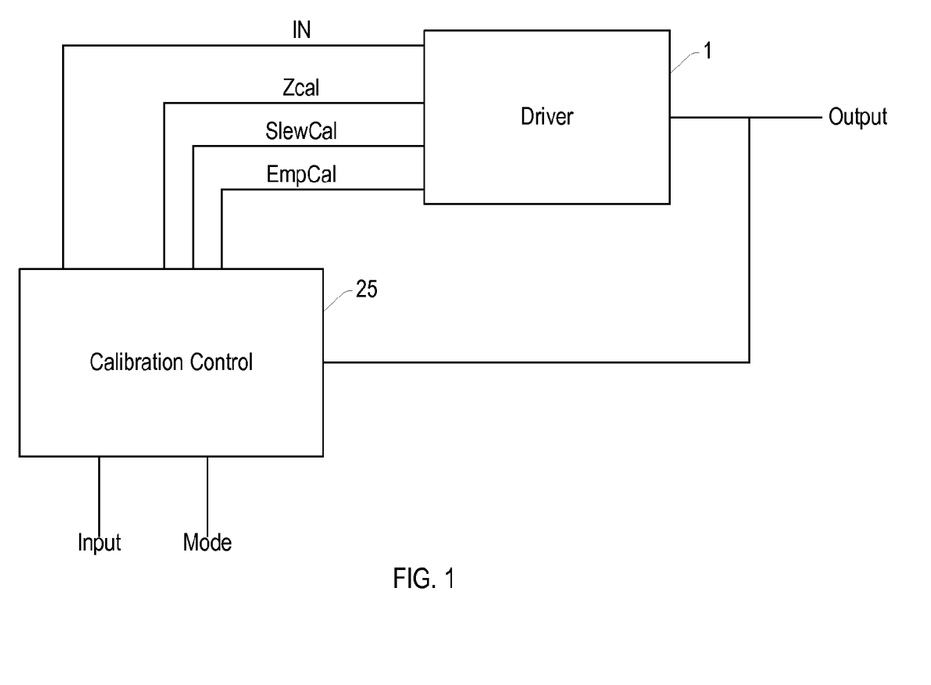
FIG. 1 is a functional block diagram of an output driver circuit according to a presently disclosed embodiment.

FIG. 1 is a functional block diagram of an output driver circuit according to a presently disclosed embodiment. The output driver circuit may be implemented, for example, in a CMOS integrated circuit. The output driver circuit may be used, for example, in an SoC to transmit signals to a memory interface of a memory integrated circuit. The output impedance of the output driver circuit is calibrated and the results of that calibration can be used to adjust equalization of the output of the output driver circuit.

The output driver circuit includes a driver module 1 that can drive the output of the output driver circuit to a high level or a low level. The driver module 1 may also be in a high-impedance state where the driver module 1 does not drive the output.

The driver module 1 drives the output with one or more controllable output impedances set by one or more calibration codes. For example, the driver module 1 may drive the output high with an output impedance set by a first calibration code and drive the output low with an output impedance set by a second calibration code. The driver module 1 also drives the output with one or more equalization levels set by one or more equalization codes. In the embodiment of FIG. 1, the equalization levels include slew rates of the output set by slew-rate controls (SlewCal) and pre-emphasis set by pre-emphasis controls (EmpCal).

The output driver circuit includes a calibration control module 25 that controls calibration and equalization of the driver module 1. The calibration control module 25 receives a data input (Input) that signals the data to be driven by the output driver circuit and a mode input (Mode) that signals the operating mode of the output driver circuit. The operating modes of the output driver circuit include modes such as a disabled mode, a high-speed mode, a low-speed mode, and an output impedance calibration mode.

The calibration control module 25 calibrates the driver module to determine one or more calibration codes (Zcal) that set the output impedance of the driver module 1. For example, the calibration control module 25 may determine a calibration code that produces a desired impedance by comparing the output impedance of the driver module 1 to a resistor. The calibration codes may include a first code used when the driver module 1 is driving the output high and a second code used when the driver module 1 is driving the output low. In some embodiments, a replica circuit rather than the driver module 1 may be used to determine the calibration code.

The calibration control module 25 uses the impedance calibration code (or codes) to determine the one or more equalization codes. For example, when the impedance calibration code indicates that transistors in the driver module 1 are weak (slow), the calibration control module 25 can select a faster slew rate control to compensate for the slower transistors. Impedance calibration codes, in an embodiment, include separate codes for different types of transistors (e.g., a calibration code that indicates the strength of n-channel transistors and a calibration code that indicates the strength of p-channel transistors). The equalization codes may then be selected according to the effects of the specific types of transistors. For example, a pre-emphasis for rising edges of the output of the output driver circuit may be increased when the calibration code indicative of p-channel transistors indicates that p-channel transistors are weak. The calibration codes and equalization codes (e.g., slew-rate controls and pre-emphasis controls) adjust electrical characteristics of the driver module and may be referred to as parametric control signals.

Figure 2:
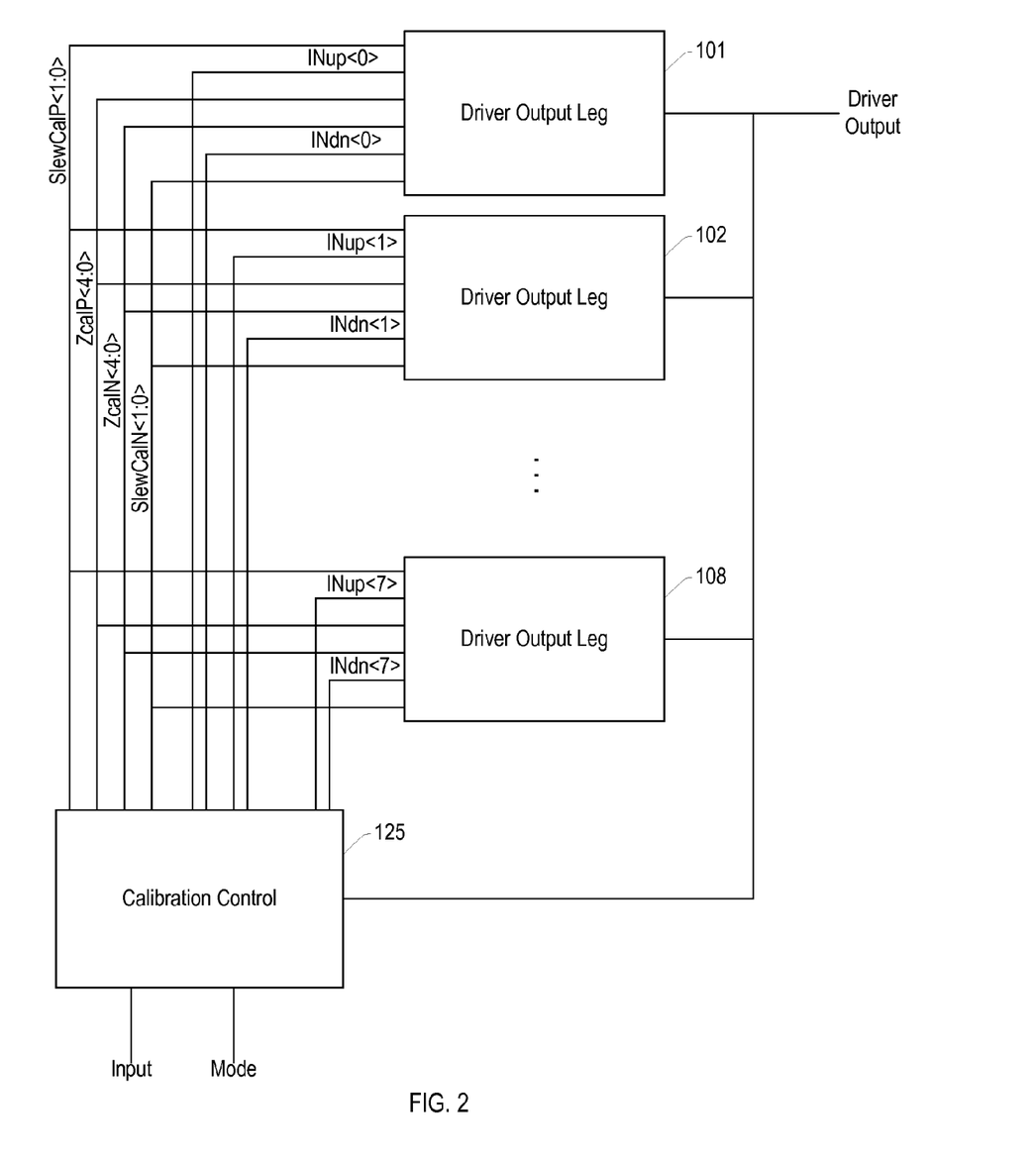
FIG. 2 is a functional block diagram of an output driver circuit according to a presently disclosed embodiment.

FIG. 2 is a functional block diagram of an output driver circuit according to a presently disclosed embodiment. The output driver circuit will be described for a particular implementation, although it should be understood that many other implementations are possible including those where different numbers various elements (e.g., seven driver output legs rather than the eight driver output legs shown in FIG. 2) are used. The output driver circuit may be implemented, for example, in a CMOS integrated circuit. The output driver circuit may be used, for example, on an SoC to drive a memory interface of a memory chip such as DDR SDRAM.

The output impedance of the driver circuit is calibrated and the results of that calibration can be used to adjust slew rates of the driver output and pre-emphasis on the driver output. In other embodiments, only slew rate or pre-emphasis is adjusted. The output driver circuit includes eight driver output legs 101-108. The output driver circuit of FIG. 2 may be viewed as implementation of the output driver circuit of FIG. 1 with the driver output legs 101-108 implementing the driver module 1. Each driver output leg receives a pull-up enable signal (INup<7:0>) that enables a pull-up portion of the driver output leg and a pull-down enable signal (INdn<7:0>) that enables a pull-down portion of the driver output leg.

Each driver output leg also receives parametric control signals that adjust electrical characteristics of the driver output leg. The parametric control signals include a calibration code for the pull-up impedance (ZcalP<4:0>), a calibration code for the pull-down impedance (ZcalN<4:0>), an equalization code for the slew rate of rising transitions (SlewCalP<1:0>), and an equalization code for the slew rate of falling transitions (SlewCalN<1:0>).

The parametric control signals are supplied by a calibration control module 125. The calibration control module 125 receives a data input (Input) that signals the data to be driven by the output driver circuit and a mode signal (Mode) that signals the operating mode of the output driver circuit. The operating modes of the output driver circuit include modes such as a disabled mode, a high-speed mode, a low-speed mode, and an output impedance calibration mode.

Figure 3:
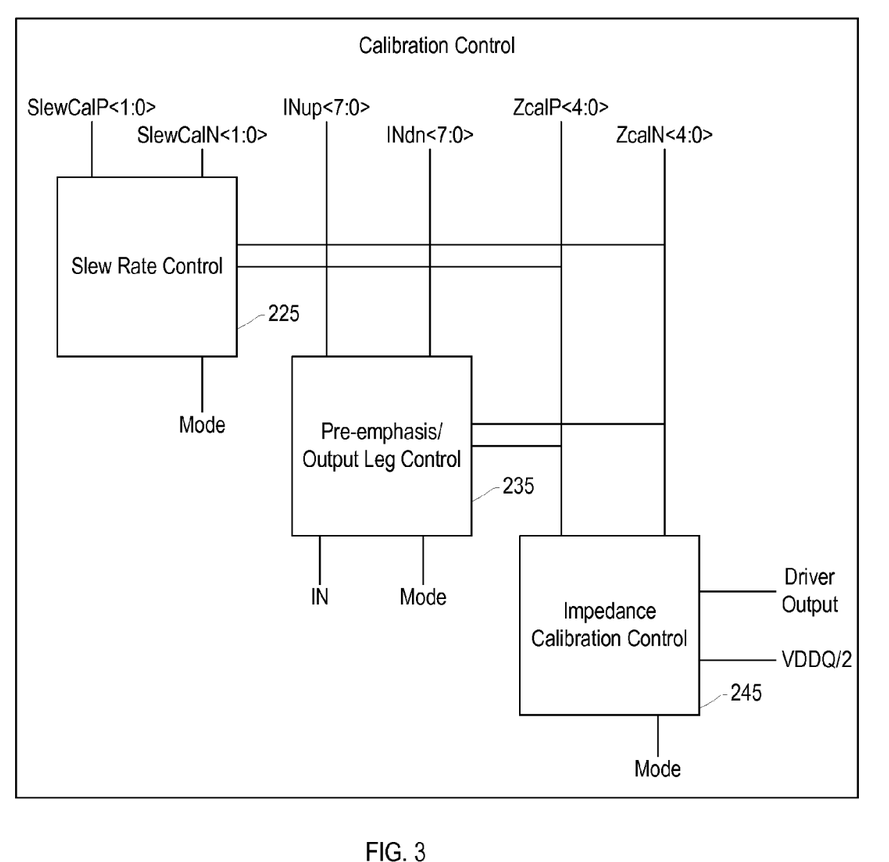
FIG. 3 is a functional block diagram of a calibration control module according to a presently disclosed embodiment.

FIG. 3 is a functional block diagram of a calibration control module according to a presently disclosed embodiment. The calibration control module may be used to implement the calibration control module 125 of the output driver circuit of FIG. 2.

The calibration control module includes an impedance calibration control module 245 that is used to calibrate the output impedance of the output driver circuit. This calibration is performed with the output driver in situ and thus can compensate for variations in process, voltage, and temperature. The calibration control module may perform calibration when a device containing the output driver circuit begins operation. The calibration control module may also perform calibration dynamically during operation of the device; for example, calibration may be performed periodically, when a mode of the output driver circuit changes, or when another mode of the device containing the output driver circuit change. Since the calibration control module adjusts pre-emphasis and slew rate control settings based on the calibration, dynamic calibration allows the pre-emphasis and slew rate to adapt, for example, to changing temperature as reflected in the calibration codes.

An example calibration control procedure includes enabling the pull-up section of one driver output leg to drive a 240-ohm resistor connected to ground. Other measured (or calibrated) impedances may also be used. The impedance calibration procedure then adjusts the calibration control for the pull-up impedance (ZCalP) until the output voltage is about one-half the supply voltage (VDDQ/2). For example, the impedance calibration procedure may increment the calibration control and select the first calibration code where the output voltage of the driver exceeds one-half the supply voltage. The impedance calibration procedure then enables both the pull-up and pull-down sections of one driver output leg, and adjusts the calibration control for the pull-down impedance (ZCalN) until the output voltage is about one-half the supply voltage (VDDQ/2).

The codes for the calibration controls for the pull-up impedance and the pull-down impedance are both used to control the output impedances of all of the driver output legs. However, the codes for the pull-up impedance and the pull-down impedance are independent.

The above-described calibration procedure results in each of the driver output legs having an output impedance of approximately 240 ohms in one embodiment. Other calibration procedures may be also used, including procedures that calibrate using a replica circuit of the driver output leg rather than the driver output leg of an actual output driver circuit. Additionally, other impedance values and comparison levels may be used. Further, the pull-up and pull-down drive impedances may be intentionally mismatched.

The impedance calibration control module 245 can also control when the impedance controls are changed. Changing impedance generally stops communication on the associated interface. Thus, the impedance calibration control module 245 may operate to reduce the number of changes. For example, the impedance controls may be changed only when there is a large change (e.g., 10%) in the impedance or a change in mode (e.g., from a high-speed mode to a low-speed mode). Avoiding changes when there is not a large change can be particularly effective in a system that works well even when the impedance is somewhat different from the nominal value.

The calibration code for the pull-up impedance (ZCalP) is an indication of the strength of the p-channel transistors in the output driver circuit. The calibration code for the pull-down impedance (ZCalN) an indication of the strength of the n-channel transistors in the output driver circuit. The strengths of the transistors may also be referred to as the speed of the transistors. A larger calibration code for the pull-up impedance (e.g., enabling more parallel circuit elements) indicates a slow-P process condition and a smaller calibration code indicates a fast-P process condition. Similarly, a larger calibration code for the pull-down impedance indicates a slow-N process condition and a smaller calibration code indicates a fast-N process condition.

The calibration control module includes a pre-emphasis/output leg control module 235 that is used to control whether each of the driver output legs is driving the output high, is driving the output low, or is disabled. Different numbers of the driver output legs can be enabled to control the output impedance of the combined output driver circuit. The output impedance may be set based on the mode. For example, the mode may indicate that four driver output legs should be enabled to produce a 60 ohm (the four drivers are in parallel and each has a 240 ohm output impedance) output impedance.

The driver output legs are enabled by buffering the input data signal (IN) to supply the pull-up enable signals (INup <7:0>) and the pull-down enable signals (INdn <7:0>). The driver output legs are disabled by setting the pull-up enable signals (INup <7:0>) HIGH and the pull-down enable signals (INdn <7:0>) LOW.

The pre-emphasis/output leg control module 235 can also control the driver output legs to provide pre-emphasis on the output of the driver circuit. One or more extra (over those enabled to control the output impedance of the output driver circuit) driver output legs are momentarily enabled on transitions of the input data signal to add extra drive strength on output transitions. For example, a first set of the driver output legs may receive buffered versions of the input signal to the output driver circuit and a second set of the driver output legs may receive pulses after transitions of the input signal (with the pull-up enable signals pulsed after rising edges and the pull-down signals pulsed after falling edges). The number of driver output legs in the first set is based on the desired output impedance of the driver circuit and the number of driver output legs in the second is based on the amount of pre-emphasis (which is set from the impedance calibration).

In an embodiment, a one-shot is triggered on falling edges of the data input signal and the output of the one shot is used to turn on the pull-down enable signals of the extra driver output legs and another one-shot is triggered on rising edges of the data input signal and the output of this one shot is used to turn on the pull-up enable signals of the extra driver output legs. The number of extra driver output legs and/or the duration of one shots can be adjusted to compensate for variations in circuit speed (e.g., due to process, temperature, and voltage variation). The adjustment is based on the output impedance calibration codes. The pre-emphasis/output leg control module 235 can map the calibration codes to values for the adjustment.

The pre-emphasis may be different for rising and falling transitions. For example, the pre-emphasis for rising transitions may be set based on the calibration control for the pull-up impedance and the pre-emphasis for falling transitions may be set based on the calibration control for the pull-down impedance. The pre-emphasis/output leg control module 235, in an embodiment, increases the number of extra driver output legs for rising output transitions when the calibration code for the pull-up impedance indicates weaker than nominal p-channel transistors. Conversely, the pre-emphasis/ output leg control module 235, in an embodiment, decreases the number of extra driver output legs for rising output transitions when the calibration code for the pull-up impedance indicates stronger than nominal p-channel transistors. Similarly, the pre-emphasis/output leg control module 235, in an embodiment, increases the number of extra driver output legs for falling output transitions when the calibration code for the pull-down impedance indicates weaker than nominal n-channel transistors and decreases the number of extra driver output legs for falling output transitions when the calibration code for the pull-down impedance indicates stronger than nominal n-channel transistors. Nominal values may, for example, be values that reflect targeted or average fabrication process conditions, supply voltage, and operating temperature.

The amount of pre-emphasis can also vary with the operating mode of the output driver circuit. For example, pre-emphasis may be reduced or eliminated in a lower speed mode.

The calibration control module includes a slew rate control module 225 that is used to adjust the driver output legs to control output slew rates. The slew rate control module 225 can control the drive strength of pull-up and pull-down pre-driver circuits (see FIG. 4) in the driver output legs to adjust the output slew rates. The equalization control for the slew rate of rising transitions (SlewCalP<1:0>) is set based on the speed of the p-channel transistors as indicated by the calibration code for the pull-up impedance (ZcalP<4:0>). The equalization control for the slew rate of falling transitions (SlewCalN<1:0>) is set based on the speed of the n-channel transistors as indicated by the calibration code for the pull-down impedance (ZcalN<4:0>).

The slew rate control module 225 can also adjust the slew rate based on the operating mode of the output driver circuit. For example, slew rates may be reduced in a lower speed mode.

Since the pre-emphasis and the slew rate control are adjusted using the output impedance calibration, which is performed with the output driver circuit in its system and thus can compensate for variations in process, voltage, and temperature, the pre-emphasis adjustment and slew rate control adjustment are also compensated for variations in process, voltage, and temperature.

Figure 4:
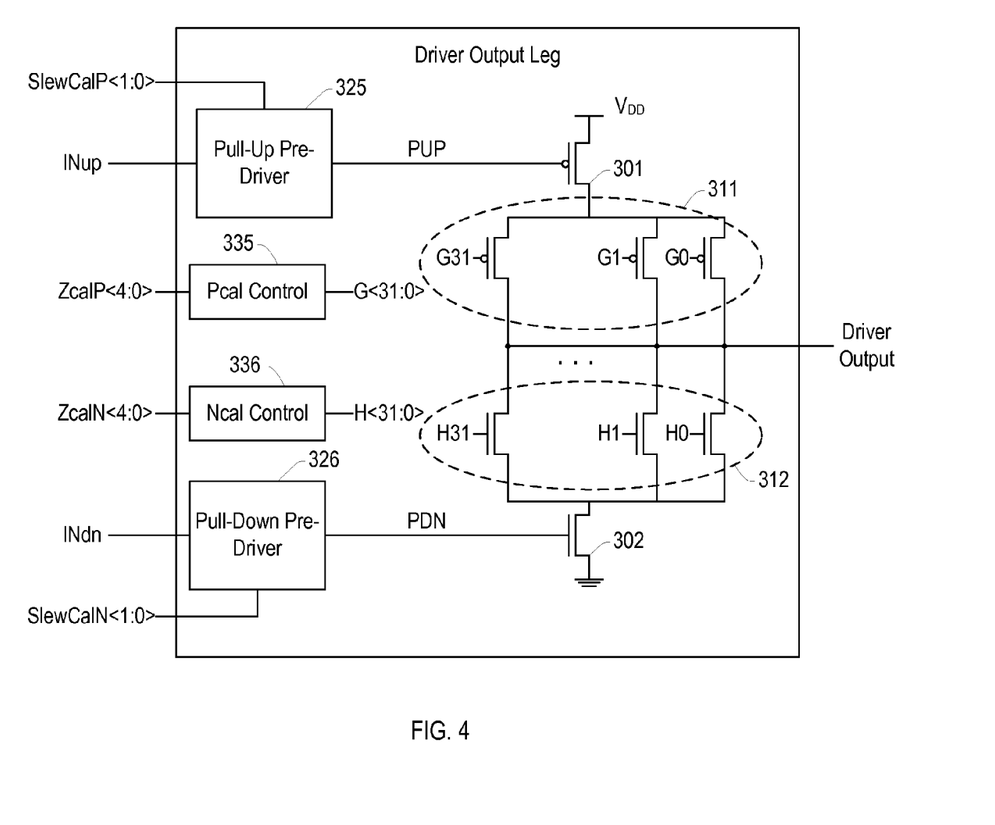
FIG. 4 is a functional block diagram of a driver output leg according to a presently disclosed embodiment.

FIG. 4 is a functional block diagram of a driver output leg according to a presently disclosed embodiment. The driver output leg may be used to implement the driver output legs 101-108 in the output driver circuit of FIG. 2.

The output impedance of the driver output leg is controlled based on the calibration code for the pull-up impedance (ZcalP<4:0>) for the pull-up impedance and the calibration code for the pull-down impedance (ZcalN<4:0>) for the pull-down impedance.

A configurable pull-up impedance 311 is controlled to set the pull-up impedance; a configurable pull-down impedance 312 is controlled to set the pull-down impedance. The configurable pull-up impedance 311 includes multiple p-channel transistors coupled in parallel with a variable number of the p-channel transistors enabled to change the impedance. In other embodiments, resistors may be connected in series with each transistor. Additionally, a resistor may be connected in parallel with the transistors. The configurable pull-up impedance 311 (and the configurable pull-down impedance 312) may be implemented in other ways, for example, by varying bias voltages or currents.

A Pcal control module 335 decodes the calibration code for the pull-up impedance (ZcalP<4:0>) to produce enables (G0-31) for the gates of the p-channel transistors in the configurable pull-up impedance 311. For example, the Pcal control module 335 may include a binary-to-thermometer decoder to enable the number of p-channel transistors indicated by the calibration control.

A pull-up p-channel transistor 301 is connected in series with the configurable pull-up impedance 311 between a supply voltage (VDD) and the driver output. A pull-up p-channel transistor 301 operates as a switch. The configurable pull-up impedance 311 and the pull-up p-channel transistor 301 form a pull-up output stage that has a controllable output impedance. The controllable output impedance is set by the calibration code for the pull-up impedance.

A pull-up pre-driver 325 drives the gate (PUP) of the pull-up p-channel transistor 301 based on the pull-up enable signal (INup) to switch the pull-up output stage off and on. The pull-up pre-driver 325 buffers the pull-up enable signal with variable strength based on the equalization code for the slew rate of rising transitions (SlewCalP). Controlling the drive strength of the pull-up pre-driver 325 controls the slew rate of the driver output by controlling the speed at which the pull-up p-channel transistor 301 turns on. In an embodiment, the pull-up p-channel transistor 301 and the configurable pull-up impedance 311 may be combined with the pull-up pre-driver 325 enabling a variable number (based on the calibration code for the pull-up impedance) of p-channel transistors coupled between the supply voltage and the driver output.

A complementary circuit is used for the pull-down of the driver output leg using a configurable pull-down impedance 312, a pull-down pre-driver 326, an Ncal control module 336, and a pull-down n-channel transistor 302. The configurable pull-down impedance 312 and the pull-down n-channel transistor 302 form a pull-down output stage that has a controllable output impedance. The controllable output impedance is set by the calibration code for the pull-down impedance.

Figure 5:
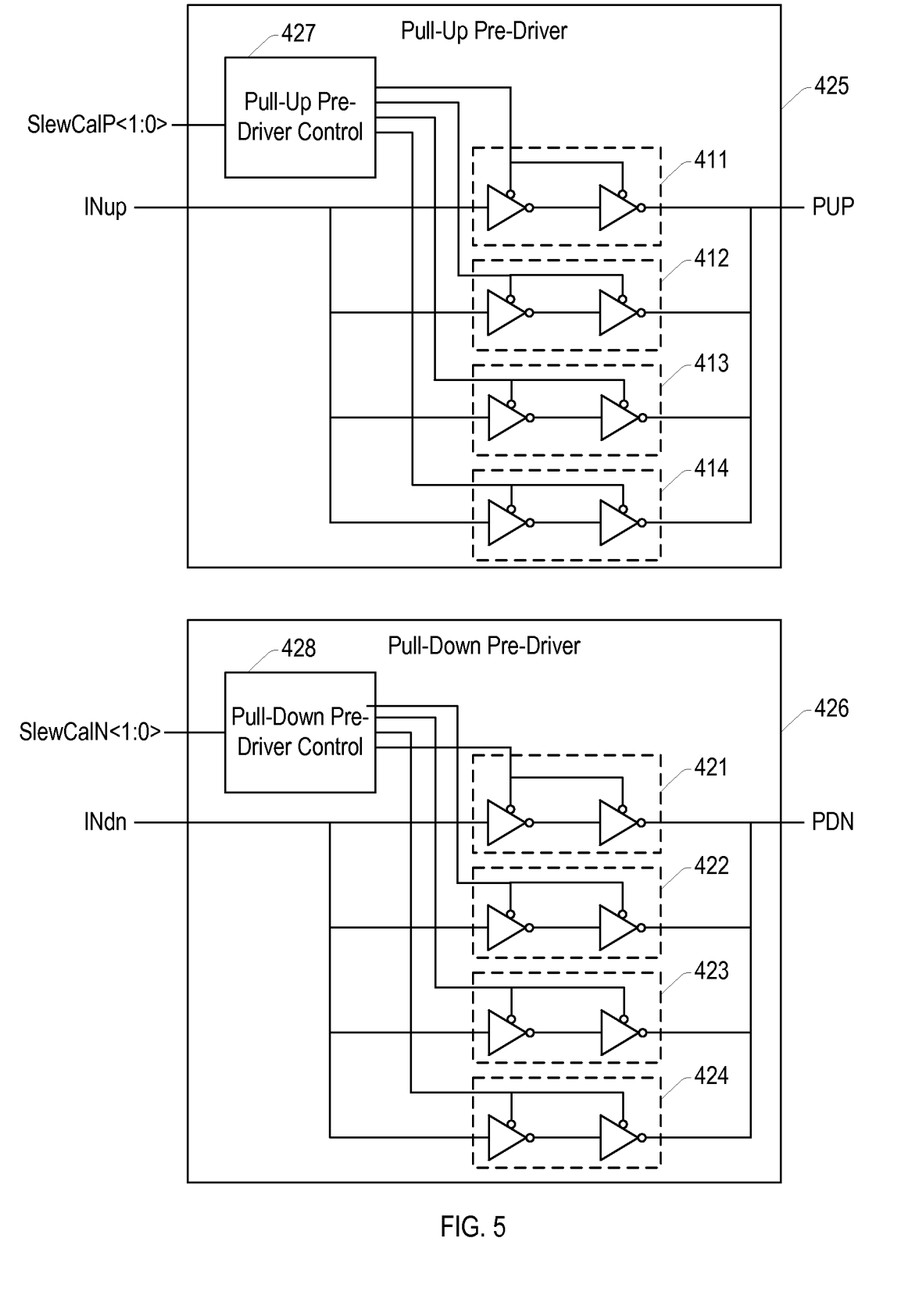
FIG. 5 is a functional block diagram of pre-driver circuits according to a presently disclosed embodiment.

FIG. 5 is a functional block diagram of pre-driver circuits according to a presently disclosed embodiment. The pre-driver circuits include a pull-up pre-driver 425 and a pull-down pre-driver 426. The pull-up pre-driver 425 may be used to implement the pull-up pre-driver 325 of the driver output leg of FIG. 4. The pull-down pre-driver 426 may be used to implement the pull-down pre-driver 326 of the driver output leg of FIG. 4.

The pull-up pre-driver 425 includes four pre-driver buffers 411-414 connected in parallel to buffer the pull-up enable signal (INup) to produce the PUP signal that drives the gate of the pull-up p-channel transistor 301. Each buffer can be enabled or disabled. The buffers can be, for example, formed using tristatable inverters. A pull-up pre-driver control module 427 decodes the equalization code for the slew rate of rising transitions (SlewCalP) to enable the indicated number of buffers (e.g., when SlewCalP=0b00, enable 1 buffer, when SlewCalP=0b01, enable 2 buffers, etc.). The number of enabled buffers controls the drive strength of the pull-up pre-driver 425 and, as described above, thereby controls the slew rate of rising outputs of the output driver circuit.

The pull-down pre-driver 426 includes four pre-driver buffers 421-424 connected in parallel to buffer the pull-down enable signal (INdn) to produce the PDN signal that drives the gate of the pull-down n-channel transistor 302. Each buffer can be enabled or disabled. The buffers can be, for example, formed using tristatable inverters. A pull-down pre-driver control module 428 decodes the equalization code for the slew rate of rising transitions (SlewCalN) to enable the indicated number of buffers. The number of enabled buffers controls the drive strength of the pull-down pre-driver and, as described above, thereby controls the slew rate of falling outputs of the output driver circuit.

The pre-emphasis/output leg control module 235 of FIG. 3 can supply the equalization code for the slew rate of rising transitions to the pull-up pre-driver 425 and the equalization code for the slew rate of rising transitions to the pull-down pre-driver 426. The pre-emphasis/output leg control module, in an embodiment, sets the equalization code for the slew rate of rising transitions to increase the number of enabled pre-driver buffers 411-414 in the pull-up pre-driver 425 when the calibration code for the pull-up impedance indicates weaker than nominal p-channel transistors. This increases the slew rate of the PUP signal and thereby compensates for the weaker than nominal p-channel transistors in the pull-up output stage. Conversely, the pre-emphasis/output leg control module 235, in an embodiment, sets the equalization code for the slew rate of rising transitions to decrease the number of enabled pre-driver buffers 411-414 in the pull-up pre-driver 425 when the calibration code for the pull-up impedance indicates stronger than nominal p-channel transistors. This decreases the slew rate of the PUP signal and thereby compensates for the stronger than nominal p-channel transistors in the pull-up output stage. Similarly, the pre-emphasis/output leg control module 235, in an embodiment, sets the equalization code for the slew rate of falling transitions to increase the number of enabled pre-driver buffers 421-424 in the pull-down pre-driver 426 when the calibration code for the pull-down impedance indicates weaker than nominal n-channel transistors and sets the equalization code for the slew rate of falling transitions to decrease the number of enabled pre-driver buffers 421-424 in the pull-down pre-driver 426 when the calibration code for the pull-down impedance indicates stronger than nominal n-channel transistors.

Figure 6:
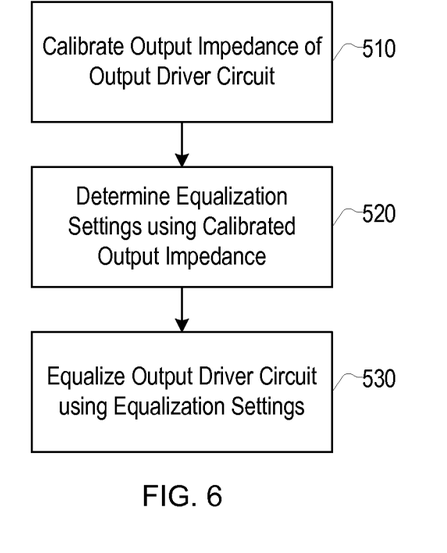
FIG. 6 is a flowchart of a process for auto-equalization of an output driver circuit based on impedance calibration according to a presently disclosed embodiment.

FIG. 6 is a flowchart of a process for auto-equalization of an output driver circuit based on impedance calibration according to a presently disclosed embodiment. The process can be used with many driver circuits but, to provide a specific example, will be described with reference to the circuits of FIGS. 2-5.

In block 510, the output impedance of the output driver circuit is calibrated. For example, the number of p-channel transistors to enable in the configurable pull-up impedance 311 and the number n-channel transistors to enable in the configurable pull-down impedance 312 are determined by comparing the output impedance to a reference resistor. The number of p-channel transistors and number of n-channel transistors to enable are independent. The output impedance calibration can be performed, for example, according to a memory interface standard.

In block 520, equalization settings for the output driver circuit are determined based on the impedance calibration from block 510. This allows the equalization to be automatically set and it can be set without special-purpose calibration measurements. Accordingly, the equalization can be performed for interface standards that do not include equalization calibration or training features.

Determining the equalization settings can include settings for pre-emphasis and for slew rates. The equalization settings and the impedance calibration are generally digital controls. The bit widths of the digital controls may each be different.

The equalization settings (codes) can be determined by various methods. In an embodiment, the equalization settings are algebraically mapped from the calibration code. For example, the calibration control for the slew rate of rising transitions (SlewCalP<1:0>) may be the most-significant bits of the calibration control for the pull-up impedance (ZcalP<4:0>). Alternatively or additionally, offsets may be added or subtracted. Other relationships, for example, an inverse relationship, between the equalization settings and the calibration codes may also be used.

In other embodiments, the equalization settings are mapped from the calibration codes using look-up tables. The lookup table may be hard-coded or programmable. Additionally, equalization settings may be based on the calibration codes for both the pull-up impedance and the pull-down impedance.

In block 530, the equalization settings from block 520 are used to set the equalization of the driver output circuit. For example, the calibration control module 125 may set the calibration codes for the slew rate and control the pull-up and pull-down enable signals so the output driver circuit drives equalized signals on the output. After the output driver circuit has its impedance calibrated in block 510 and its equalization adjusted in block 530, the output driver circuit can drive its output with improved reliably.

The circuits and methods described herein utilize the observation that impedance calibration codes provide general information about circuit speeds and this information can be used to adjust other circuit controls to control parameters such as slew rate and pre-emphasis. The advantages of these techniques include that they allow for pull-up and pull-down asymmetries (e.g., differences between p-channel transistor and n-channel transistor process conditions), the equalization can be automatic and does not require additional calibration steps or user feedback, and can adjust equalization settings for process conditions.

Although embodiments of the invention are described above for particular embodiments, many variations of the invention are possible. For example, the numbers of various components may be increased or decreased and different signal polarities may be used. The embodiments have been described for CMOS technology but similar circuits may be used with other technologies. Additionally, features of the various embodiments may be combined in combinations that differ from those described above.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent presently preferred embodiments of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. An output driver circuit, comprising:
   a driver module configured to drive an output of the output driver circuit, wherein the driver module has one or more controllable output impedances set by one or more calibration codes and one or more equalization levels set by one or more equalization codes; and
   a calibration control module configured to
      calibrate the driver module to determine the one or more calibration codes to set the output impedance of the driver module to one or more predetermined impedances and
      determine the one or more equalization codes based on the one or more calibration codes.

2. The output driver circuit of claim 1, wherein the one or more equalization levels include a pre-emphasis on the output of the output driver circuit.

3. The output driver circuit of claim 1, wherein the one or more equalization levels include a slew rate of the output of the output driver circuit.

4. The output driver circuit of claim 3, wherein the one or more equalization levels include a slew rate of rising transitions on the output of the output driver circuit controlled by a first equalization code of the one or more equalization codes and a slew rate of falling transitions on the output of the output driver circuit controlled by a second equalization code of the one or more equalization codes.

5. The output driver circuit of claim 2, wherein the driver module comprises a plurality of driver output legs having their outputs coupled in parallel to the output of the output driver circuit, wherein each of the driver output legs includes:
    a pull-up output stage having a controllable output impedance set by a first calibration code of the one or more calibration codes;
    a pull-down output stage having a controllable output impedance set by a second calibration code of the one or more calibration codes;
    a pull-up pre-driver configured to switch the pull-up output stage off and on based on a pull-up enable signal; and
    a pull-down pre-driver configured to switch the pull-down output stage off and on based on a pull-down enable signal,
    wherein the calibration control module is further configured to
        supply the pull-up enable signals and the pull-down enable signals to a first set of the plurality of driver output legs based on a data input to the output driver circuit and
        supply the pull-up enable signals and the pull-down enable signals to a second set of the plurality of driver output legs based on transitions on the data input to the output driver circuit, wherein the number of driver output legs in the second set of the plurality of driver output legs is based on the pre-emphasis on the output of the driver circuit.

6. The output driver circuit of claim 5, wherein the number of driver output legs in the first set of the plurality of driver output legs is set to provide a predetermined output impedance of the output driver circuit.

7. The output driver circuit of claim 5, wherein the calibration control module is further configured to include more than a nominal number of driver output legs in the second set of the plurality of driver output legs for rising transitions of the output of the output driver circuit when the first calibration code indicates a weaker than nominal pull-up output stage and to include more than a nominal number of driver output legs in the second set of the plurality of driver output legs for falling transitions of the output of the output driver circuit when the second calibration code indicates a weaker than nominal pull-down output stage.

8. The output driver circuit of claim 5, wherein the calibration control module is further configured to set the first calibration code and the second calibration code based on a measured impedance.

9. The output driver circuit of claim 5, wherein:
    the pull-up pre-driver has a first controllable drive strength set by a first equalization code of the one or more equalization codes; and
    the pull-down pre-driver has a second controllable drive strength set by a second equalization code of the one or more equalization codes, and
    wherein the calibration control module is further configured to determine the first equalization code and the second equalization code to control slew rates of the output of the output driver circuit.

10. The output driver circuit of claim 9, wherein the controllable output impedance of the pull-up output stage is set by enabling or disabling multiple pull-up elements and wherein the calibration control module is further configured is further configured to determine the first equalization code to set the first controllable drive strength to a greater than nominal value when the number of pull-up elements enabled is more than a nominal number.

11. The output driver circuit of claim 9, wherein the controllable output impedance of the pull-down output stage is set by enabling or disabling multiple pull-down elements and wherein the calibration control module is further configured is further configured to determine the first equalization code to increase set the second controllable drive strength to a greater than nominal value when the number of pull-down elements enabled is more than a nominal number.

12. The output driver circuit of claim 4, wherein the driver module comprises
    a driver output leg including:
        a pull-up output stage having a controllable output impedance set by a first calibration code of the one or more calibration codes;
        a pull-down output stage having a controllable output impedance set by a second calibration code of the one or more calibration codes;
        a pull-up pre-driver having a first controllable drive strength set by the first equalization code and configured to switch the pull-up output stage off and on based on a pull-up enable signal; and
        a pull-down pre-driver having a second controllable drive strength set by the second equalization code and configured to switch the pull-down output stage off and on based on a pull-down enable signal,
    wherein the calibration control module is further configured to supply the pull-up enable signal and the pull-down enable signal to the driver output leg based on a data input to the output driver circuit.

13. The output driver circuit of claim 12, wherein the calibration control module is further configured to calibrate the driver module based on a measured impedance.

14. The output driver circuit of claim 12, wherein the controllable output impedance of the pull-up output stage is set by enabling or disabling multiple pull-up elements and wherein the calibration control module is further configured to determine the first equalization code based on the number of pull-up elements enabled.

15. The output driver circuit of claim 12, wherein the controllable output impedance of the pull-down output stage is set by enabling or disabling multiple pull-down elements and wherein the calibration control module is further configured to determine the second equalization code based on the number of pull-down elements enabled.

16. A method of auto-equalizing an output driver circuit, the method comprising:
    calibrating an output impedance of the output driver circuit to determine at least one calibration code that produces a predetermined impedance;
    determining an equalization setting for the output driver circuit based on the at least one calibration code; and
    setting an equalization control of the output driver circuit using the equalization setting.

17. The method of claim 16, wherein the equalization control adjusts a pre-emphasis on the output of the output driver circuit.

18. The method of claim 16, wherein the equalization control adjusts a slew rate of the output of the output driver circuit.

19. The method of claim 16, wherein the at least one calibration code is set based on a measured impedance of the output driver circuit.

20. The method of claim 16, wherein determining the equalization setting for the output driver circuit based on the at least one calibration code includes using a programmable lookup table.

21. The method of claim 16, wherein the at least one calibration code and the equalization setting are digital controls having different bit widths.

22. An output driver circuit, comprising:
a plurality of means for driving an output having their outputs coupled in parallel to an output of the output driver circuit, wherein each of the means for driving includes:
  a pull-up output stage having a controllable output impedance set by a first calibration code;
  a pull-down output stage having a controllable output impedance set by a second calibration code;
  a pull-up pre-driver configured to switch the pull-up output stage off and on based on a pull-up enable signal; and
  a pull-down pre-driver configured to switch the pull-down output stage off and on based on a pull-down enable signal; and
a means for calibrating the output driver circuit configured to calibrate the output driver circuit to determine the first calibration code and the second calibration code to set the output impedance of the output driver circuit and determine one or more equalization settings for the output driver circuit based on the first calibration code and the second calibration code.

23. The output driver circuit of claim 22, wherein the one or more equalization settings include a pre-emphasis on the output of the output driver circuit.

24. The output driver circuit of claim 23, wherein the means for calibrating is further configured to:

supply the pull-up enable signals and the pull-down enable signals to a first set of the plurality of means for driving based on a data input to the output driver circuit; and
supply the pull-up enable signals and the pull-down enable signals to a second set of the plurality of means for driving based on transitions on the input to the output driver circuit and the pre-emphasis on the output of the output driver circuit, wherein the number of means for driving in the second set of the plurality of means for driving is based on the calibration codes.

25. The output driver circuit of claim 24, wherein the number of means for driving in the first set of the plurality of means for driving is set to provide a predetermined output impedance of the output driver circuit.

26. The output driver circuit of claim 22, wherein the one or more equalization settings includes a slew rate of the output of the output driver circuit.

27. The output driver circuit of claim 26, wherein the pull-up pre-driver has a first controllable drive strength set by a first equalization code of the one or more equalization codes, the pull-down pre-driver has a second controllable drive strength set by a second equalization code of the one or more equalization codes, and the means for calibrating is further configured to set the first equalization code and the second equalization code to control the slew rate of the output of the output driver circuit.

28. The output driver circuit of claim 27, wherein the controllable output impedance of the pull-up output stage is set by enabling or disabling multiple pull-up elements and the first equalization code is set based on the number of pull-up elements enabled.

29. The output driver circuit of claim 28, wherein the controllable output impedance of the pull-down output stage is set by enabling or disabling multiple pull-down elements and the second equalization code is set based on the number of pull-down elements enabled.

30. The output driver circuit of claim 27, wherein the means for calibrating is further configured to set the first calibration code and the second calibration code based on a measured impedance.

* * * * *